(12) United States Patent
Glass et al.

(10) Patent No.: US 10,516,021 B2
(45) Date of Patent: Dec. 24, 2019

(54) REDUCED LEAKAGE TRANSISTORS WITH GERMANIUM-RICH CHANNEL REGIONS

(71) Applicant: INTEL CORPORATION, Santa Clara, CA (US)

(72) Inventors: Glenn A. Glass, Portland, OR (US); Karthik Jambunathan, Hillsboro, OR (US); Anand S. Murthy, Portland, OR (US); Chandra S. Mohapatra, Hillsboro, OR (US); Seiyon Kim, Portland, OR (US); Jun Sung Kang, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/777,553

(22) PCT Filed: Dec. 24, 2015

(86) PCT No.: PCT/US2015/000415
§ 371 (c)(1),
(2) Date: May 18, 2018

(87) PCT Pub. No.: WO2017/111849
PCT Pub. Date: Jun. 29, 2017

(65) Prior Publication Data
US 2018/0331184 A1    Nov. 15, 2018

(51) Int. Cl.
*H01L 29/10* (2006.01)
*H01L 29/161* (2006.01)
(Continued)

(52) U.S. Cl.
CPC ........ *H01L 29/1083* (2013.01); *H01L 21/764* (2013.01); *H01L 29/0649* (2013.01);
(Continued)

(58) Field of Classification Search
None
See application file for complete search history.

(56) References Cited

U.S. PATENT DOCUMENTS

| | | | |
|---|---|---|---|
| 8,912,602 B2 | 12/2014 | Hsu et al. | |
| 9,349,868 B1 * | 5/2016 | Balakrishnan | ...... H01L 29/7856 |

(Continued)

FOREIGN PATENT DOCUMENTS

WO      2017/111849      6/2017

OTHER PUBLICATIONS

International Search Report and Written Opinion received for Patent Application No. PCT/US2015/000415, dated Aug. 24, 2016, 15 pages.

(Continued)

*Primary Examiner* — Herve-Louis Y Assouman
(74) *Attorney, Agent, or Firm* — Finch & Maloney PLLC

(57) ABSTRACT

Techniques are disclosed for fabricating semiconductor transistor devices configured with a sub-fin insulation layer that reduces parasitic leakage (i.e., current leakage through a portion of an underlying substrate between a source region and a drain region associated with a transistor). The parasitic leakage is reduced by fabricating transistors with a sacrificial layer in a sub-fin region of the substrate below at least a channel region of the fin. During processing, the sacrificial layer in the sub-fin region is removed and replaced, either in whole or in part, with a dielectric material. The dielectric material increases the electrical resistivity of the substrate between corresponding source and drain portions of the fin, thus reducing parasitic leakage.

20 Claims, 8 Drawing Sheets

(51) Int. Cl.
  *H01L 29/06* (2006.01)
  *H01L 21/764* (2006.01)
  *H01L 29/66* (2006.01)
  *H01L 29/78* (2006.01)

(52) U.S. Cl.
  CPC ...... *H01L 29/0676* (2013.01); *H01L 29/1054* (2013.01); *H01L 29/161* (2013.01); *H01L 29/66545* (2013.01); *H01L 29/66795* (2013.01); *H01L 29/78* (2013.01); *H01L 29/785* (2013.01)

(56) References Cited

U.S. PATENT DOCUMENTS

| | | | |
|---|---|---|---|
| 2005/0233565 A1* | 10/2005 | Zhu | H01L 29/66795 438/602 |
| 2007/0284648 A1 | 12/2007 | Park et al. | |
| 2014/0225065 A1* | 8/2014 | Rachmady | H01L 29/42392 257/24 |
| 2014/0264253 A1* | 9/2014 | Kim | H01L 29/0673 257/9 |
| 2015/0041898 A1 | 2/2015 | Loubet et al. | |
| 2015/0084041 A1* | 3/2015 | Hur | H01L 29/7832 257/43 |
| 2015/0162436 A1* | 6/2015 | Toh | H01L 29/785 257/401 |
| 2015/0333171 A1* | 11/2015 | Hsu | H01L 21/764 257/347 |
| 2015/0348967 A1 | 12/2015 | Lee et al. | |

OTHER PUBLICATIONS

International Preliminary Report on Patentability received for Patent Application No. PCT/US2015/000415, dated Jun. 26, 2018, 11 pages.

* cited by examiner

REDUCED LEAKAGE TRANSISTORS WITH GERMANIUM-RICH CHANNEL REGIONS

BACKGROUND

A FinFET is a transistor built around a thin strip of semiconductor material (generally referred to as the fin) that extends from an underlying substrate. This fin-shaped semiconductor element acts as the channel region of the device. The transistor includes the standard field-effect transistor (FET) nodes, including a gate, a gate dielectric, a source region, and a drain region. The conductive channel of the transistor effectively resides on sides of the fin beneath the gate dielectric. Specifically, current runs along/within both sidewalls of the fin (i.e., on sides perpendicular to the underlying substrate surface) as well as along the top of the fin (i.e., on a side parallel to the underlying substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor, sometimes referred to as a gate-all-around transistor, is effectively a fin that has a relatively low aspect ratio because some underlying portion of the fin is removed so that the gate stack material can surround the channel region on all sides.

DETAILED DESCRIPTION

Figure 1A:
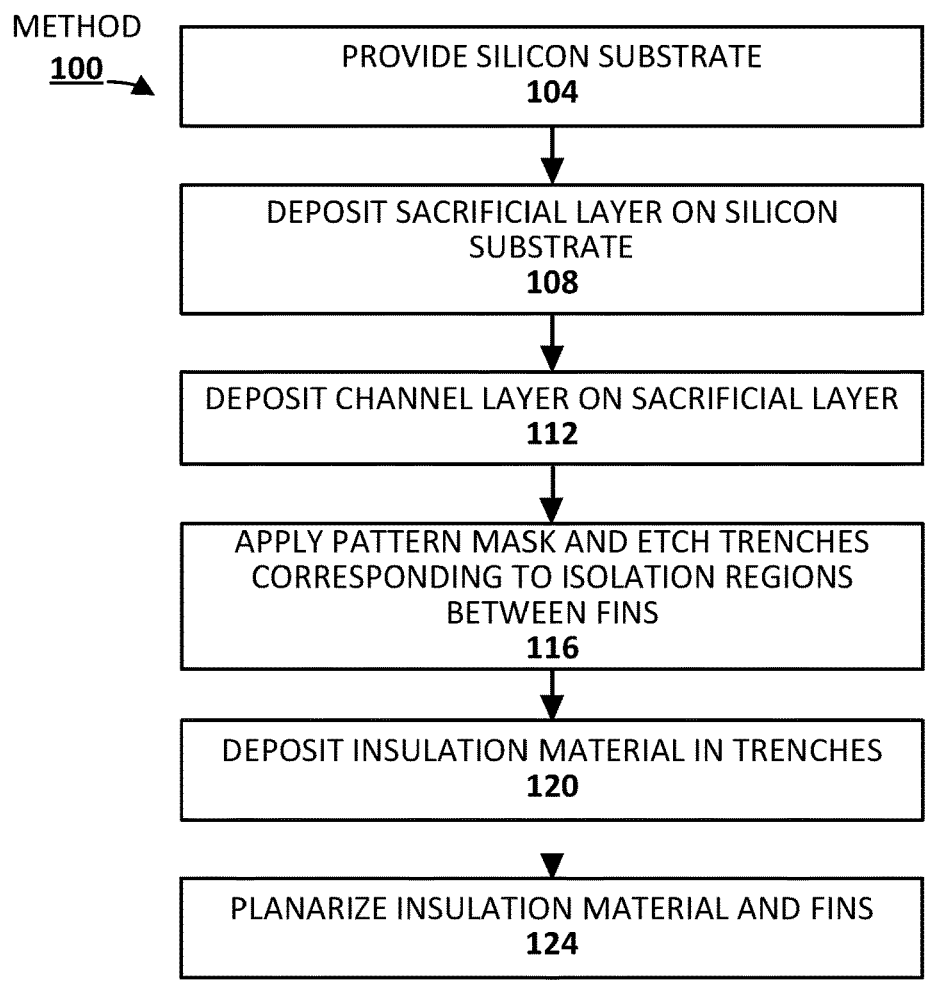
FIGS. 1A and 1B illustrates a method for preparing a substrate used to form a reduced leakage transistor, in accordance with various embodiments of the present disclosure.

Techniques are disclosed for fabricating semiconductor transistor devices configured with a sub-fin insulation layer that reduces parasitic leakage (i.e., current leakage through a portion of an underlying substrate between a source region and a drain region associated with a transistor). In some embodiments, the integrated circuits include channel regions with germanium concentrations of at least 60 atomic percent ("at. %"). The parasitic leakage is reduced by fabricating transistors with a sacrificial layer in a sub-fin region of the substrate below at least a channel region of the fin. During processing, the sacrificial layer in the sub-fin region is removed and replaced, either in whole or in part, with a dielectric material. The dielectric material increases the electrical resistivity of the substrate (i.e., the ungated region below the active channel) between corresponding source and drain portions of the fin, thus reducing parasitic leakage.

General Overview

Improving performance of successive generations of semiconductor devices has become more challenging as the dimensions of transistors have decreased to the nanometer scale. As the dimensions of transistors have decreased, materials once used only for select applications have been explored for broader applicability in transistors. One such material is germanium (Ge). Using germanium as part of a transistor, specifically for source, drain, and channel regions, improves some aspects of performance of the transistor. But using high concentrations (e.g., more than 40 at. %) of germanium in source, drain, and channel regions also increases current leakage through a sub-fin region of the substrate between a source region of a non-planar transistor (e.g., a finFET) to the drain region of the non-planar transistor. Regardless of the composition of a transistor, "parasitic current" reduces the performance of transistors because of increased power consumption, and increased heat generation. One solution to address parasitic current is to fabricate transistors on a substrate that includes semiconductor layer on an underlying blanket layer of electrical insulator across an entire substrate. This configuration is sometimes called a buried oxide (BOX) layer configuration, or a semiconductor-on-insulator (or "XOI" where X is any semiconductor) substrate. One specific XOI substrate example includes a blanket layer of silicon dioxide ($SiO_2$) on a silicon (Si) substrate. Transistors prone to parasitic leakage that are fabricated on XOI substrates are more likely to perform well because the blanket insulation layer that extends over the entire substrate blocks parasitic leakage paths regardless of where transistors are fabricated on the substrate. Fabrication of XOI substrates and devices, however, can have various disadvantages. Disclosed herein are methods for fabricating structures that include many advantages (e.g., reduced parasitic leakage) of XOI substrates even though "bulk" (e.g., non-XOI) substrates are used.

To this end, various embodiments of the present disclosure include transistors and methods of fabricating transistors that include an insulation layer in a sub-fin region between the upper channel layer and the underlying substrate. In some embodiments, this insulation layer extends under the channel region of the transistor. In still other embodiments, this insulation layer further extends under some or all of a source region and/or a drain region of the transistor. In some embodiments, the insulation layer does not extend into regions of the substrate beyond those corresponding to source, drain, and channel regions (in contrast to a typical BOX or XOI configuration). In other embodiments, the insulation layer does not extend into inactive regions of the substrate (e.g., areas that include electrically inactive or so-called dummified structures that are provided as part of a global forming process). As will be appreciated, these various embodiments are unlike BOX or XOI substrates, in which the blanket layer of insulator extends globally throughout all areas of a substrate, and not just under the channel, source, and drain regions or in an otherwise local fashion. Because of this, various embodiments of the present disclosure may improve the performance of transistors otherwise prone to parasitic leakage by reducing current leakage through an underlying semiconductor substrate without the inconvenience and expense of BOX/XOI processing.

To improve the electrical isolation between source and drain regions of a transistor, some of the embodiments of the present disclosure include techniques for providing a sacrificial layer in a sub-fin region below a source region, a drain region, and a channel region of a transistor (approximately corresponding to a fin of a fin-based transistor). In some embodiments, this sacrificial layer is removed from a sub-fin region approximately corresponding to at least the channel region, thus etching a chamber below the channel region of the fin. In other embodiments, the sacrificial layer is removed from some or all of a sub-fin region corresponding to the source region, the drain region and the channel region, such that the chamber below the channel continues at least partially under the source and/or drain regions. Note that once the sacrificial layer is removed, the upper channel portion of the fin effectively becomes a nanowire channel. Likewise, if the sacrificial layer is also removed from under the source/drain portions of the fin, they too effectively become nanowire-based source/drains. In any such embodiments, the etch-formed chamber is filled, either in whole or in part, with a dielectric material, such that the walls of the chamber are least partially coated with the dielectric material. Whether the chamber is partially or entirely coated and/or filled with dielectric material, the resistivity of the sub-fin region between the source and drain regions increases so that parasitic current leakage is reduced or eliminated. This improves the performance of transistors and semiconductor devices that would otherwise be prone to parasitic source to drain or drain to source leakage. In still other embodiments, the dielectric-coated chamber is unfilled and includes an air-gap, or is further filled with some other material. In one such embodiment, the dielectric-coated chamber is at least partially filled with gate electrode material (e.g., a metal), as a result of the dielectric-coated chamber being exposed during a subsequent gate forming process or so-called replacement metal gate (RMG) process. Note that once the sacrificial layer is removed, the upper channel portion of the fin effectively becomes a nanowire channel.

Upon analysis (e.g., using scanning/transmission electron microscopy (SEM/TEM), composition mapping, secondary ion mass spectrometry (SIMS), atom probe imaging, 3D tomography, etc.), a structure or device configured in accordance with one or more embodiments will effectively show a chamber coated or filled with a dielectric layer, or a chamber coated with a dielectric layer and having an air gap (unfilled), or a dielectric-coated chamber and further at least partially filled with additional material. In any such cases, the chamber will be disposed in or on a substrate under a channel region of a fin of non-planar transistor configuration, as variously described herein. In some examples, analysis will show a void within a conformally deposited dielectric layer of the chamber.

Figure 1B:
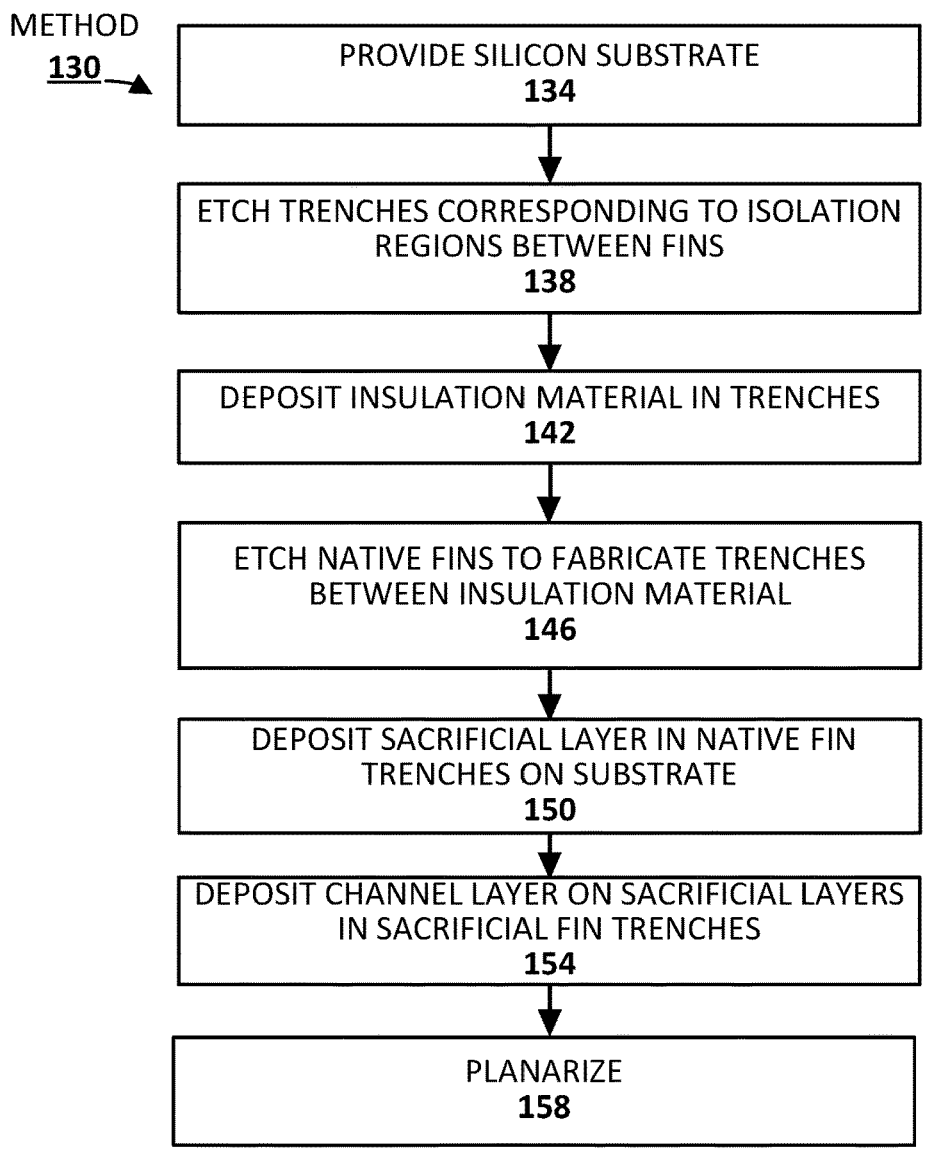
Figure 1C:
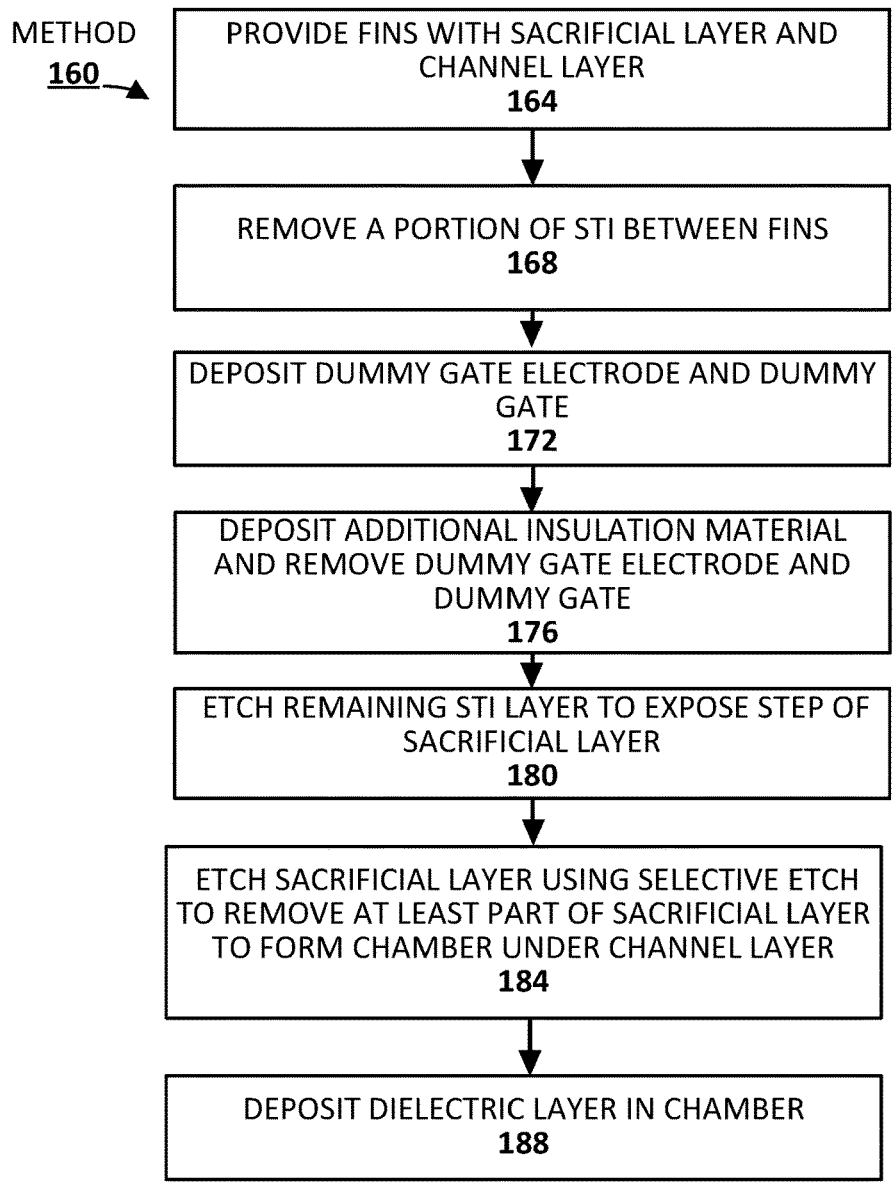
FIG. 1C illustrates a method for fabricating a reduced leakage transistor using a sub-fin insulation layer, in accordance with various embodiments of the present disclosure.

Layer Architecture and Methodology: Sacrificial Layer and Channel Layer Blanket Deposition FIGS. 1A and 1B illustrate two example methods 100 and 130, respectively, for fabricating fins, a sacrificial layer, and other structures associated with an integrated circuit, in accordance with one or more embodiments of the present disclosure. Some embodiments of various structures fabricated using the example methods 100 and 130 are illustrated in FIGS. 2A-D. The example methods 100 and 130 produce equivalent structures which are shown, respectively, in FIGS. 2B and 2D. Regardless of which of the fin-forming methods 100 or 130 is used, the method 160 of FIG. 1C illustrates an example method for further processing of the resulting fin-based structures produced by the example methods 100 and 130. In one embodiment, the example method 160 is used to fabricate an integrated circuit transistor device with low current leakage through a sub-fin portion of the substrate from a source region to a drain region (i.e., "parasitic leakage") of the transistor using an insulation layer disposed in a sub-fin region below at least a channel region of the fin. The embodiments described herein can be applied to any number of transistor designs, dopant levels, and fin compositions, including fins with germanium concentrations of at least 60 at. %. Example structures fabricated by the method 160 of FIG. 1C are illustrated in FIGS. 3A-3H.

Turning now to the example method 100 of FIG. 1A, a silicon substrate is provided 104. While the method 100 indicates a silicon substrate is used as a starting point for this process, as does the method 130 of FIG. 1B, it will be understood that this is merely for convenience of explanation. Any number of suitable substrate configurations can be used as alternatives to silicon, including bulk substrates of other semiconductors and multi-layered substrate structures.

In a more general sense, any substrate upon which sacrificial fins can be formed can be used. In other implementations, the semiconductor substrate may be formed using alternate materials, which may include, but are not limited, to germanium, indium antimonide, lead telluride, indium arsenide, indium phosphide, gallium arsenide, or gallium antimonide, to name a few examples. Further semiconductor materials classified as group III-V or group IV materials of the periodic table may also be used to form the substrate. Although a few examples of materials from which the substrate may be formed are described here, any material that may serve as a foundation upon which a semiconductor device may be built falls within the spirit and scope of the present disclosure.

Figure 2A:
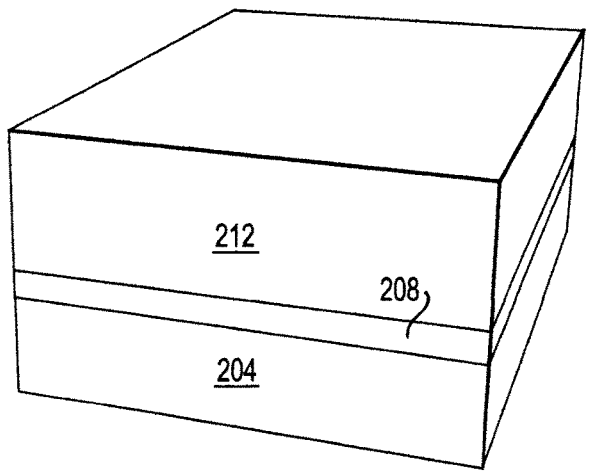
FIGS. 2A-D illustrate example structures formed when carrying out the methods of FIGS. 1A and 1B, in accordance with various embodiments of the present disclosure.

In the example method 100, a sacrificial layer is deposited 108 as a blanket layer that conforms to a planar surface of the provided substrate. An illustration of this configuration is shown in FIG. 2A, in which the sacrificial layer 208 is conformally deposited on a substrate 204. In some embodiments, the sacrificial layer 208 is silicon (Si). In still other embodiments, the sacrificial layer 208 is an alloy of germanium and tin (Sn). In still other examples, the sacrificial layer 208 is an alloy of silicon and germanium (SiGe). In some embodiments, regardless of the element that is alloyed with germanium, the germanium content of the sacrificial layer is less than approximately 40 at. %. In some embodiments, the sacrificial layer is 208 includes a germanium content that is at least 10 at. % Ge less than that of a subsequently deposited channel layer 212 that is ultimately used to fabricate a fin of a non-planar transistor, as will be explained below in more detail. In still other embodiments, the sacrificial layer is 208 includes a germanium content that is at least 20 at. % less than that of a subsequently deposited channel layer 212. This can include a sacrificial layer of silicon (Si). In some examples, the sacrificial layer 208 may include carbon, whether locally concentrated in carbon-rich regions or carbon-rich precipitates, or uniformly distributed throughout the sacrificial layer 208. In other embodiments, the sacrificial layer 208 may include a strain-relaxed buffer layer (not shown) of germanium, GeSn, or SiGe that is adjacent to the substrate 204. In a more general sense, the sacrificial layer 208 is a material that exhibits sufficient etch selectivity to the channel layer 212, such that when the sacrificial layer 208 is etched away, the channel layer 212 remains mostly intact.

The sacrificial layer 208, regardless of composition, is either native substrate or is deposited using any appropriate technique including chemical vapor deposition (CVD), atomic layer deposition (ALD), molecular beam epitaxy (MBE), Rapid thermal CVD (RTCVD), gas source MBE (GS-MBE), and others. Continuing with the example method 100, and with continued reference to the embodiment shown in FIG. 2A, a channel layer 212 is conformally deposited 112 on the sacrificial layer 208. The channel layer corresponds to a material that, when etched, is used to form a fin in a fin-based transistor. In some embodiments, the channel layer 212 is an alloy of semiconductor materials having a high germanium content. For example, in some embodiments, the germanium content of the channel layer 212 is at least 60 at. %. In other embodiments, the germanium content of the channel layer 212 is at least 70 at. %. In other embodiments, the germanium content of the channel layer 212 is at least 80 at. %. In other embodiments, the germanium content of the channel layer 212 is at least 90 at. %. In some embodiments, regardless of the specific concentration value of germanium in the channel layer 212, the concentration is at least 10 at. % higher than the germanium concentration in the sacrificial layer 208, or at least 20 at. % higher than the germanium concentration in the sacrificial layer 208. In still other embodiments, the concentration of germanium in the channel layer 212 is from approximately 10 at. % to approximately 90 at. % higher than the germanium concentration in the sacrificial layer 208. In still further embodiments, the germanium concentration of channel layer 212 is at least 98 at. % higher than the germanium concentration in the sacrificial layer 208.

Figure 2B:
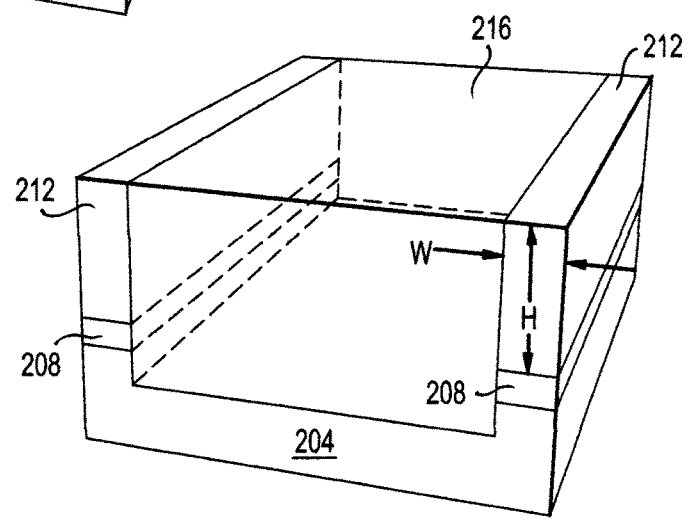

While the channel layer 212 of the embodiment in FIG. 2B is shown as including a single composition, in other embodiments the channel layer 212 may include more than one layer, each of which has a different germanium concentration (e.g., from approximately 10 at. % to approximately 70 at. % higher than the germanium concentration in the sacrificial layer 208). In other examples, the channel layer 212 may include a configuration of multiple layers, some of which have germanium concentrations from approximately 10 at. % to approximately 70 at. % higher than the germanium concentration in the sacrificial layer 208, and others of which are insulation layers, or layers that have a similar composition to the sacrificial layer 208, such that those layers will be removed along with the sacrificial layer 208, so as to liberate the remaining channel layers 212 having the higher germanium at. %. These latter examples can be used, for example, to fabricate nanowires or nanoribbons from the channel layer 212 in a given channel region.

Regardless of the final structure of the fin, the channel layer 212 can be deposited using any appropriate technique, such as CVD, ALD, MBE, and others.

The example method 100 continues by applying a pattern mask and etching 116 trenches through both of the channel layer 212 and the sacrificial layer 208, and into the substrate 204. Upon etching 116 the trenches, the separated columns of sacrificial layer 208 and channel layer 212 are referred to as "fins". In some examples, a width of the etched trenches can be determined to fabricate fins having a height (H) to width (W) aspect ratio of at least 3 to 1.

As shown in FIG. 2B, dielectric material 216 is deposited 120 into the trenches to electrically isolate fins from one another. This structure 216 can be referred to as "shallow trench isolation" or "STI." While only one trench filled with STI 216 is shown disposed between two fins in FIG. 2B, it will be appreciated that this is only for convenience of illustration and that this structure can be repeated thousands or millions of times within each semiconductor device.

In some embodiments, the pattern mask application and etching 116 can be accomplished, for example, with standard photolithography and including wet or dry etching, or a combination of etches if so desired. The geometry of the trenches (width, depth, shape, etc.) can vary from one embodiment to the next as will be appreciated, and the embodiments described herein are not intended to be limited to any particular trench geometry. In one specific example embodiment, a hardmask (i.e. a mask formed from, for example, a silicon oxide and/or silicon nitride layer and not an organic photolithographic mask) deposited on the surface of the channel layer 212 to protect areas corresponding to the fins from a dry etch used to form the trenches. Any number of trench configurations can be used depending on the desired fin height, as will be apparent. The trenches can be subsequently filled using any number of suitable deposition processes. In one specific embodiment having a silicon substrate, the insulating STI dielectric material is $SiO_2$, but any number of suitable isolation dielectric materials can be used to form the shallow trench isolation structures here. In general, the deposited or otherwise grown isolation dielectric material for filling the trenches can be selected, for example, based on compatibility with the native oxide of the substrate material.

In the embodiment shown in FIG. 2B, the deposited STI 216 and an exposed surface of the channel layer 212 are planarized 124 using, for example, chemical mechanical planarization (CMP) or other suitable process capable of planarizing the structure. In the example embodiment shown, any mask over the fins and the STI is completely removed. Other embodiments may utilize a selective planarization configured to leave a portion of the mask in place, which can be used in subsequent processing.

The resulting example structure shown in FIG. 2B thus includes a plurality of fins (in this case, only two of which are shown), each of which includes the sacrificial layer 208 in contact with, and disposed between, the substrate 204 and the channel layer 212.

Layer Architecture and Methodology: Sacrificial Layer and Channel Layer Growth

Figure 2C:
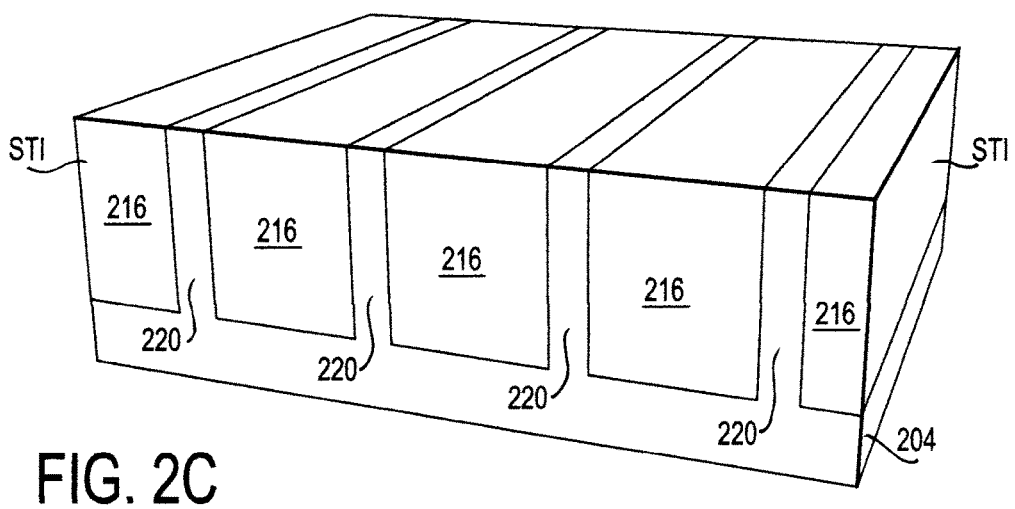

The example method 130 of FIG. 1B illustrates one alternative method for fabricating a similar structure. Referring to both FIGS. 1B and 2C, the example method 130 begins by providing 134 a silicon substrate 204. As explained above in the context of FIG. 1A and example method 100, the composition of the substrate 204 can be any one of a number of semiconductors. The substrate 204 is presented as silicon in this example only for convenience of explanation. In contrast to the method 100, which deposited blanket layers that are subsequently etched to produce trenches and which are then filled with dielectric material, the method 130 etches 138 trenches into the substrate 204 using any of the etching techniques already described above. The trenches etched into the substrate 204 are then filled with STI 216, as shown in FIG. 2C, thus defining "native" fins 220 having the same composition as the substrate 204 (in this case silicon).

The example method 130 continues by etching 146 the native fins 220 to fabricate trenches between the regions of STI 216. In some embodiments, the STI 216 is protected with a mask that can be any suitable material that will withstand the recess etch of the unmasked fins and also withstand any subsequent processing to fill the recesses with materials that are described below. Any suitable etch process can be used (e.g., wet and/or dry etch with masking and/or etch selectivity). In one example embodiment, the recess etch is a selective etch that will remove the unmasked fin material but not the STI or mask materials. In such a case, note that the mask material may also be implemented with the STI material (e.g., silicon dioxide) or any other material resistant to the fin recess etch (e.g., silicon nitride). In one specific example embodiment, the native fins are silicon and the mask is silicon dioxide and/or silicon nitride, and the recess etch is carried out using a wet etch (e.g., potassium hydroxide or other suitable etchant that will etch the unmasked silicon fins but not the STI and mask).

The depth of the native fin etch can vary from one embodiment to the next. In the example method 130, the native fin etch 146 removes a portion of the fin. In some embodiments, the etching process may alter the width of recesses, with the top of the trench being wider than the bottom in some such cases. In another embodiment where the original native fin was wider at the bottom than the top, the top may be widened to be closer to or exceed the width at the bottom. In yet another embodiment, the recess may end up with a slightly hourglass shape, wider at the top and bottom than in the middle. In yet another embodiment, the width may be substantially unchanged by the etching process. In a more general sense, the shape of the recess/fin may be changed by the etching process, but not necessarily so. The extent of the native fin removal (i.e., a depth of a resulting trench) and thickness of the sacrificial layer determine a height of a replacement fin and thus the dimensions of the portions of the replacement fin in contact with a gate that will form the channel. Because non-native materials (e.g., non-Si) can sometimes be more difficult to passivate when in contact with typical STI materials (e.g., $SiO_2$), in some embodiments the replacement fin is configured so that its entire height is in contact with a gate stack. In other embodiments, a replacement fin may extend below the gate and into the substrate.

Figure 2D:
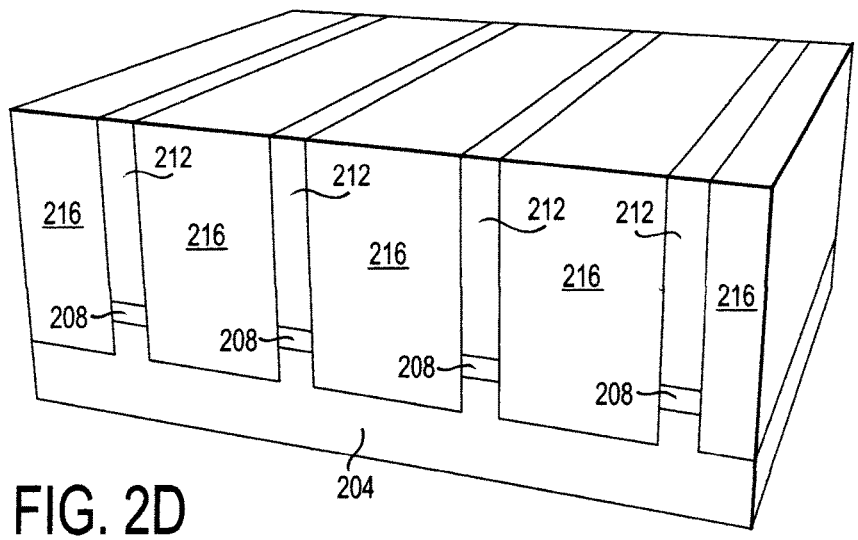

The example method 130 continues with deposition 150 of a sacrificial layer 208 at a bottom of the native fin trench, which corresponds to an exposed surface of the substrate 204 in the embodiment shown in FIG. 2D. Once the sacrificial layer 208 is deposited, the channel layer 212 is deposited 154 on top of the sacrificial layer 208. Deposition 150 and 154 of the sacrificial layer 208 and the channel layer 212 is performed using any appropriate techniques, including those masking, deposition, and etching techniques described above.

Example compositions of the sacrificial layer 208 and the channel layer 212 have been described above in the context of the example method 100 and FIGS. 1A and 2B and are also equally applicable to the embodiments fabricated by example method 130 and illustrated in FIG. 2D.

As described above in the context of the method 100 shown in FIG. 1A, an exposed surface of the deposited 142, 154 channel layer 212 and STI 216 are planarized 158. Thus, the example method 130 produces a structure shown in to 2D that is analogous to the structure produced by the example method 100 shown in FIG. 2B.

Germanium-Rich Channel Region Architecture and Methodology

Regardless of whether the example method 100, the example method 130, a variation embodiment of either method 100 or 130, or another method is used to fabricate the structures shown in FIGS. 2B and 2D (or an equivalent structure), one example method of fabricating a transistor with a germanium-rich channel region with low parasitic leakage is illustrated by the example method 160 shown in FIG. 1C. FIGS. 3A-3H provide examples of structures fabricated by performance of the method 160.

The example method 160 begins by providing 164 a structure such as the ones illustrated in FIGS. 2B and 2D, both of which include fins that include the sacrificial layer 208 disposed between the substrate 204 and the channel layer 212. As shown, these fins are inter-digitated by STI 216. A portion of STI 216 is removed 168 by etching, leaving a remaining layer of STI 216 between the fins 212 (that include a sub-fin portion of sacrificial layer 208) and on the substrate 204.

Figure 3A:
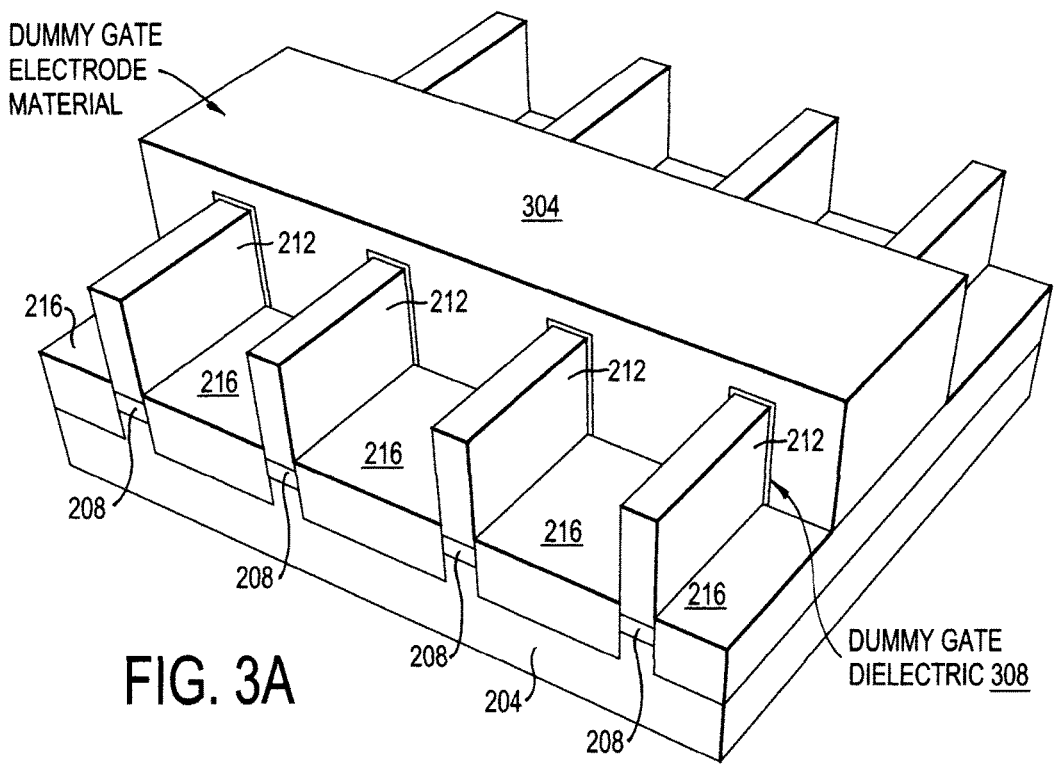
FIGS. 3A-H illustrate example structures formed when carrying out the method of FIG. 1C, in accordance with various embodiments of the present disclosure.

As shown in FIG. 3A, a dummy gate electrode 304 and dummy gate dielectric 308 are deposited 172 over a portion of each of the fins. The dummy gate dielectric 308 may be provided prior to deposition of the dummy gate electrode 304 material. This gate dielectric 308 is referred to as a dummy gate dielectric in the sense that it can be removed and replaced in a subsequent RMG process in some embodiments. Example dummy gate dielectric materials include, for instance, silicon dioxide, and example dummy gate electrode material includes polysilicon, although any suitable dummy/sacrificial gate dielectric and/or electrode materials can be used. As will be appreciated, the dimensions of the gate materials will vary from one embodiment to the next and can be configured as desired, depending on factors such as the desired device performance attributes, device size, and gate isolation. In some embodiments, processing of the portions of fins to be used as sources and drains is performed, such as dopant implantation.

Figure 3B:
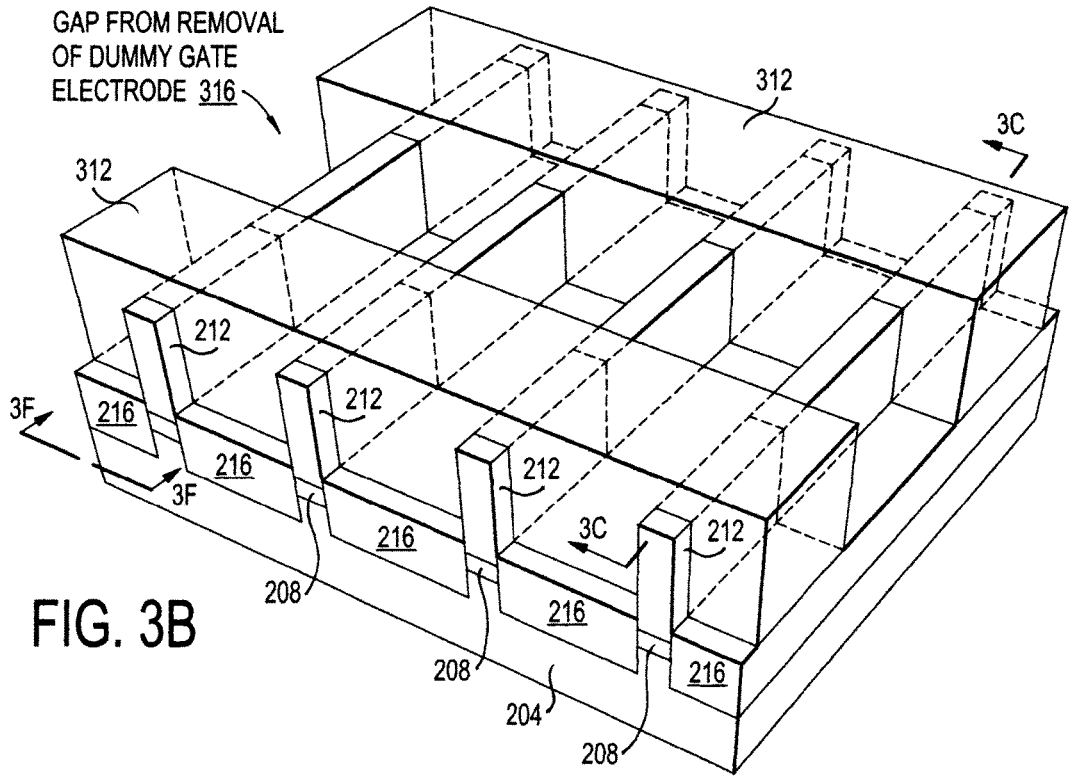

FIG. 3B illustrates a structure wherein additional insulator layer(s) 312 are deposited 176 and planarized to the top of the dummy gate electrode material 304, in accordance with an embodiment of the present disclosure. Any suitable deposition process (e.g., CVD, PVD, ALD) can be used, and the deposited insulator material may be, for example, the same material as the STI fill material (e.g., silicon dioxide) or any suitable material having the desired insulating/dielectric properties for a given application. Planarization of the additional insulator material 312 can be carried out, for example, using CMP with the dummy gate electrode material 304 as an etch stop. The dummy gate electrode 304 and dummy gate dielectric 308 are also removed 176 leaving the additional insulator layers over the fins. The dummy gate stack removal process can be carried out, for instance, via an etch process selective to the dummy gate material and that won't significantly remove the additional insulator material 312 or underlying fin materials. Numerous etch schemes can be used, as will be appreciated. This exposes a portion of each fin that, in a final transistor, will correspond to a channel region under a final gate dielectric and final gate electrode.

Figure 3C:
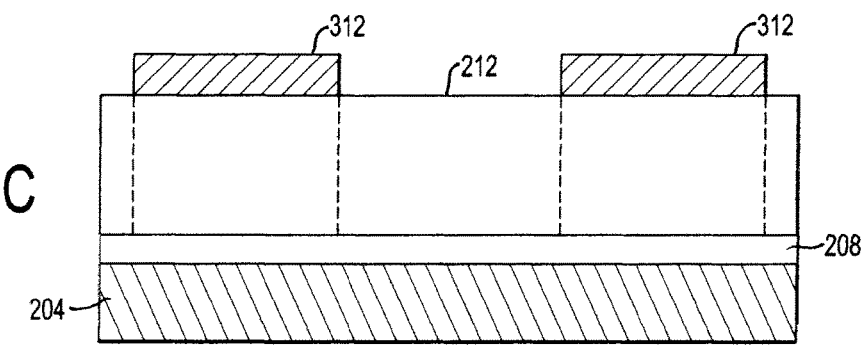

FIG. 3C illustrates a cross-sectional view of the structure in FIG. 3B taken through the structure indicated in FIG. 3B. As shown in FIG. 3C, the additional dielectric material 312 is disposed at opposite ends of each channel layer 212 leaving a center portion (previously covered by dummy gate electrode 304 and dummy gate dielectric 308) of each channel layer 212 exposed that will correspond to a channel region in an active FinFET or nanowire device. As is also shown in FIG. 3C, a sacrificial layer 208 is disposed between each channel layer 212 and the substrate 204. In some embodiments, the sacrificial layer 208 is disposed parallel to and in contact with a corresponding channel layer 212. In the embodiment shown in FIG. 3C, the sacrificial layer 208 is coextensive with a corresponding channel layer 212 (i.e., both layers having a same length). In other embodiments, the sacrificial layer 208 is disposed parallel to and in contact with a portion of a corresponding channel layer 212, such as only the channel region, or only the channel region and part of the source/drain regions, or only the channel region and all of the source/drain regions.

While not shown in the cross sectional view of FIG. 3C, a remaining layer of dielectric material 216 is disposed in a plane of the sacrificial layer 208 and may have a height that is entirely coextensive with the sacrificial layer 208 or only partly coextensive with the sacrificial layer 208.

Figure 3D:
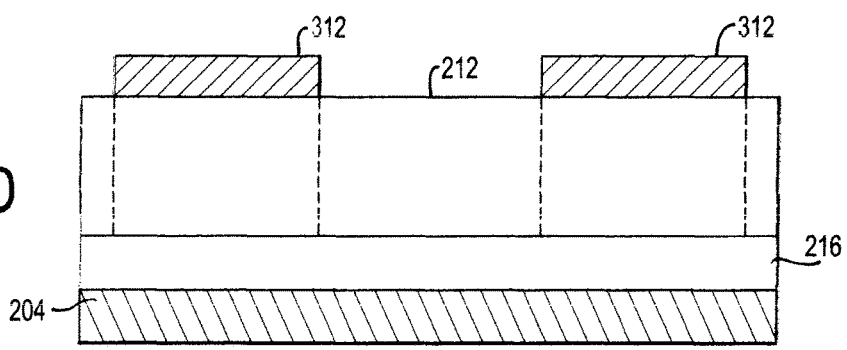
Figure 3E:
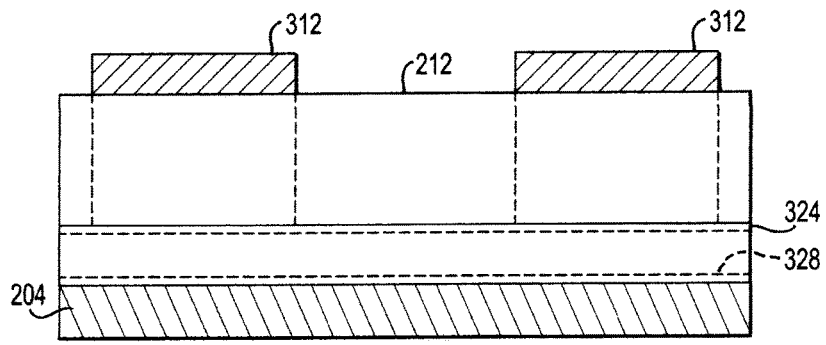
Figure 3F:
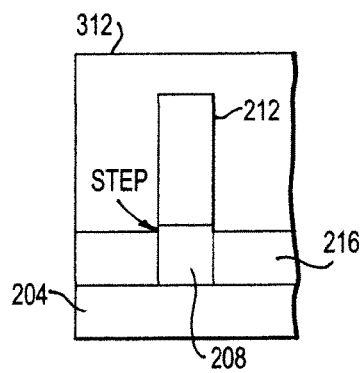

Regardless of the extent of overlap between the remaining layer of STI 216 between the fins and the sacrificial layer 208, the remaining layer of STI 216 is etched 180, using any of the techniques described above, to expose a step of the sacrificial layer 208. This configuration is shown in FIG. 3F from the perspective indicated in FIG. 3B (cross-section is taken perpendicular to the fins). That is, the remaining layer of STI 216 adjacent to the sacrificial layer 208 is etched so that an exposed "top" surface of the STI 216 is slightly lower than an interface between the channel layer 212 and the sacrificial layer 208, thereby exposing a top portion or "step" of the sacrificial layer 208 sidewall. In one embodiment, the exposed step of the sacrificial layer 208 is from approximately 1 nm to approximately 10 nm in height from the exposed "top" surface of the dielectric material 212 to an interface between the sacrificial layer 208 and the channel layer 212. While only one side is shown in FIG. 3F as including a step, both sides of the remaining STI layer 216 may be etched to expose a step of the sacrificial layer 208.

Figure 3G:
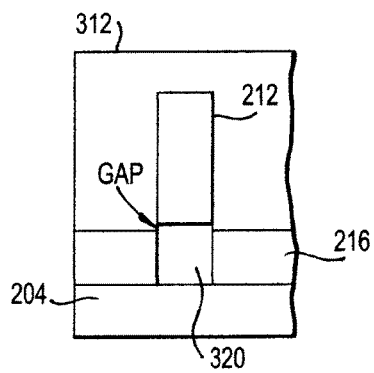

Continuing with the example method 160 shown in FIG. 1C, having thus exposed the step of the sacrificial layer 208, the sacrificial layer is etched 184. This etching 184 removes the sacrificial layer 208 to form a chamber 320. The chamber 320 is defined by the surrounding surfaces of the channel layer 212, the remaining layers of the STI 216, and the substrate 204. This is shown in FIG. 3D from the same perspective as FIG. 3C (cross-sections are taken parallel to the fins). Note that because the sacrificial layer 208 shown in FIG. 3C has been removed, FIG. 3D shows a remaining layer of the STI 216 that is now exposed in this view by the removal of sacrificial layer 208. This configuration is also shown in FIG. 3G from the same perspective as FIG. 3F (cross-section is taken perpendicular to the fins). Because the sacrificial layer has been removed, the "step" of sacrificial material in FIG. 3F is now a "gap" in FIG. 3G.

The etch 184 used to remove the sacrificial layer 208 is, in some examples, selective to the composition used to fabricate the sacrificial layer 208. That is, in one embodiment the etch 184 selectively removes materials with germanium concentrations of less than approximately 40 at. %, regardless of other alloying elements present in the sacrificial layer 208. In still other examples, the etch 184 selectively removes compositions with a germanium content at least 10 at. % less than the germanium content of the channel layer 212. In still other examples, the etch 184 selectively removes compositions with a germanium content at least 20 at. % less than the germanium content of the channel layer 212. In other examples, the etch 184 selectively removes silicon. In some embodiments, the etch 184 enables a channel layer 212 with germanium contents greater than 60 at. % or 80 at. % to remain substantially unaffected by the etch 184 while removing the sacrificial layer 208 to create the chamber 320.

Figure 3H:
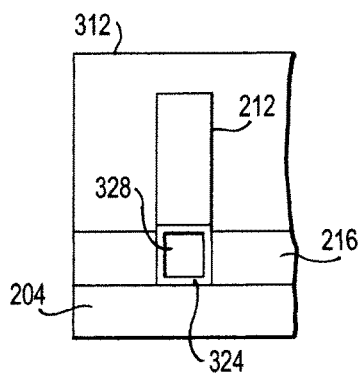

Having created the chamber 320, the chamber 320 can now be filled by depositing 188 a dielectric layer 324 within the chamber 320. This structure is shown in FIG. 3E from the same perspective as FIG. 3C (cross-sections are taken parallel to the fins). This structure is also shown in FIG. 3H from the same perspective as FIG. 3F (cross-sections are taken perpendicular to the fins). Because the dielectric layer 324 is disposed, either in whole or in part, between the channel layer 212 and the substrate 204, the dielectric layer 324 provides insulation between those portions.

The deposition 188 of the dielectric layer 324 is, in one embodiment, performed using atomic layer deposition (ALD) to deposit a conformal layer on the surfaces defining walls of the the chamber 320. An example structure is shown in FIGS. 3E and 3H. In this example, the dielectric layer 324 has been deposited on each surface of the chamber 320 so as to coat the chamber walls but does not completely fill the chamber. The air gap or void 328 within the conformally deposited dielectric layer 324 is indicated by dashed lines in FIG. 3E (indicating that this elongate void shown is within the dielectric layer 324) and a solid line 328 in FIG. 3H. In the example shown, a length of the elongate void is parallel to a length of the fin. In other embodiments, the chamber 320 is entirely filled with the dielectric layer 324. In still other embodiments, the chamber 320 is not entirely filled with the dielectric layer 324, but is pinched-off at the gap. To this end, the degree to which chamber 320 is filled can vary from one embodiment to the next, depending on factors such as when pinch-off occurs and the size of the gap). In other embodiments, methods other than ALD may be used to deposit 188 insulation layer 324 within the chamber 320. These other methods may include CVD, among others.

Example materials for replacement insulation layer 324 include silicon dioxide, silicon nitride, or other dielectric materials described above.

After the dielectric layer 324 is deposited, formation of the transistors can be completed by, for example, depositing final gate dielectric and gate electrode materials as part of the "replacement metal gate" (RMG) process. Note that dielectric layer 324 may be provided when providing the replacement gate dielectric, according to some embodiments. In addition, if the gap is not pinched-off, the chamber 320 may be further filled with the replacement gate metal, in some embodiments. Note that pinch-off of the gap may occur at any point during the various deposition processes, which is fine, so long as the chamber 320 walls are coated with dielectric material 324 sufficient to inhibit sub-fin leakage. In addition, or alternatively, completion of the transistors includes forming electrical contacts on the source/drain regions of the fins. This may be achieved, for instance, by first depositing and planarizing additional insulator material, so as to provide a surface suitable for any further processing. Then, contact trenches can then be etched through that additional insulator material, over the source/drain regions. The trenches can then be filled with contact materials using any of a variety of deposition methods. Example source drain contact materials include, for example, tungsten, titanium, silver, gold, aluminum, copper, cobalt, and alloys thereof. The contacts may include multiple layers, such as work function tuning layers, resistance-reducing layers, and capping layers.

Example System

Figure 4:
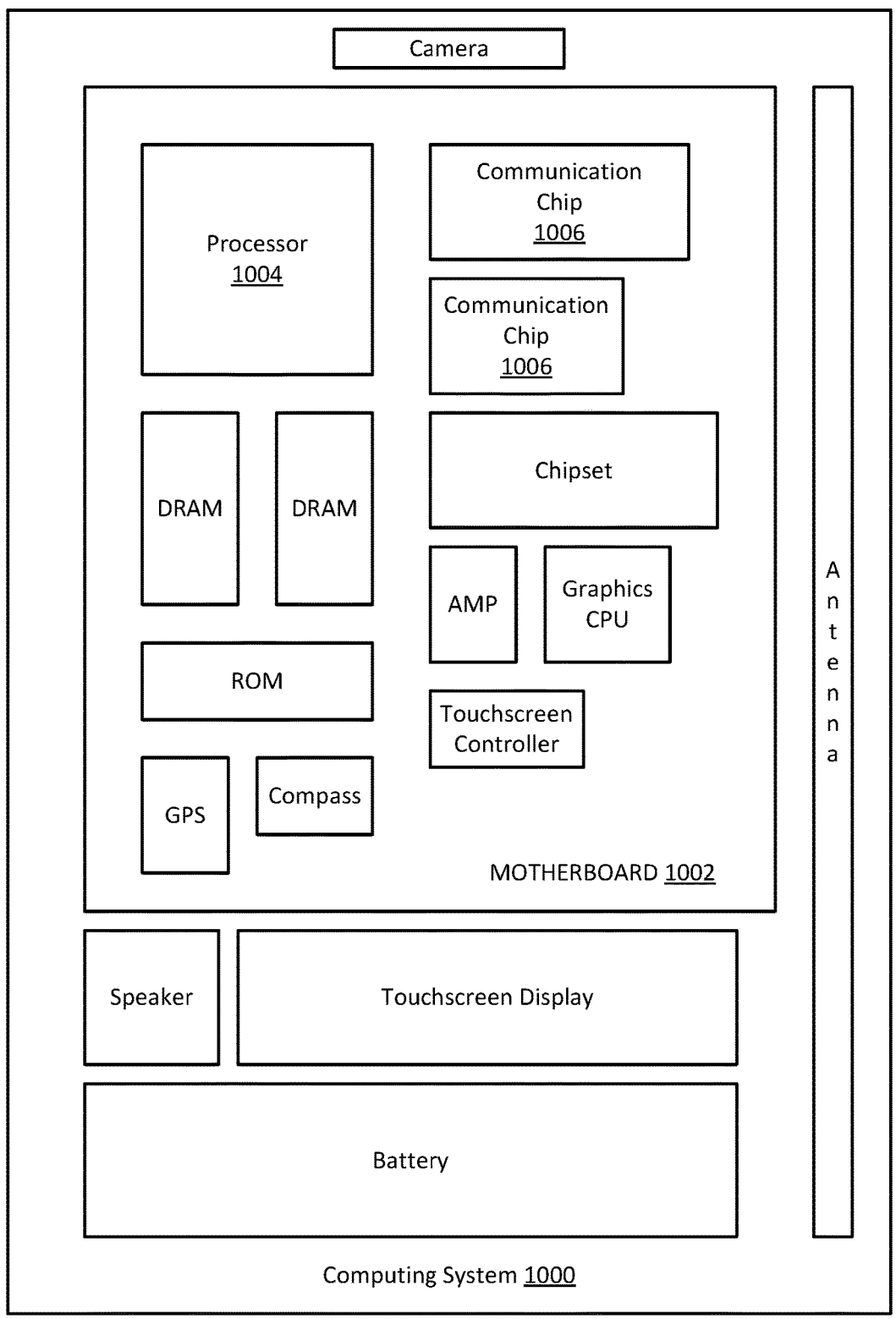
FIG. 4 illustrates a computing system implemented with integrated circuit structures or devices formed using the techniques disclosed herein, in accordance with an embodiment of the present disclosure.

FIG. 4 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004). The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit transistor device including: a substrate, a semiconductor fin extending from the substrate, the fin including a channel layer comprising a channel region, a source region, and a drain region, and a sub-fin insulation layer including a chamber, the chamber being disposed between the channel layer and the underlying substrate, wherein the chamber is defined by walls lined with a dielectric material.

Example 2 includes the subject matter of Example 1, wherein the chamber being disposed between the channel layer and the underlying substrate further extends such that it is also between the substrate and at least a portion of one or at least a portion of both of the source and drain regions of the fin.

Example 3 includes the subject matter of Examples 1-2, further including a gate dielectric material over the channel region and a gate electrode material over the gate dielectric material.

Example 4 includes the subject matter of Example 3 wherein the dielectric material lining the chamber is the same as the gate dielectric material.

Example 5 includes the subject matter of Example 4 wherein the chamber lined with the gate dielectric material is further at least partially filled with the gate electrode material.

Example 6 includes the subject matter of any of Examples 1 and 2, further including a gate dielectric material over the channel region, and a gate electrode material over the gate dielectric material, wherein the dielectric material lining the chamber is a different material from the gate dielectric material.

Example 7 includes the subject matter of any of Examples 1-6, wherein the channel layer includes at least 80 at. % germanium.

Example 8 includes the subject matter of any of Examples 1-7, wherein the sub-fin insulation layer has a length corresponding to the entire length of the fin.

Example 9 includes the subject matter of any of Examples 1-8, wherein the sub-fin insulation layer has a width corresponding to the width of the fin.

Example 10 includes the subject matter of any of Examples 1-9, wherein the dielectric material lining the walls of the chamber further defines an elongate void having a length parallel to a length of the fin.

Example 11 includes the subject matter of any of Examples 1-10, wherein the chamber comprises an air gap.

Example 12 includes the subject matter of any of Examples 1-11, wherein the chamber is pinched-off.

Example 13 includes the subject matter of any of Examples 1-12, wherein the chamber is at least partially filled another material different from the dielectric material lining the walls of the chamber.

Example 14 includes the subject matter of any of Examples 1-13, wherein the walls of the chamber are completely coated with the dielectric material lining the walls of the chamber, such that no portion of the chamber walls is uncoated with the dielectric material.

Example 15 includes the subject matter of any of Examples 1-14, further including an inactive fin proximate to the fin, the inactive fin including an inactive channel layer extending from the substrate and a sub-fin region underlying the inactive channel layer, the sub-fin region having a same composition as the substrate.

Example 16 is a computing system comprising an integrated circuit of any of Examples 1-14.

Example 17 is a semiconductor device including a substrate, a plurality of active fins extending from the substrate, each of the active fins including a channel layer comprising a channel region, a source region, and a drain region and a sub-fin insulation layer including a chamber, the chamber being disposed between the channel layer and the underlying substrate, as well as between the substrate and at least a portion of each of the source and drain regions, wherein the chamber is defined by walls lined with a dielectric material and a plurality of inactive fins extending from the substrate, each of the inactive fins including an inactive channel layer extending from the substrate and a sub-fin region underlying the inactive channel layer, the sub-fin region having a same composition as the substrate.

Example 18 includes the subject matter of Example 17 and further includes a gate dielectric material over the channel region and a gate electrode material over the gate dielectric material.

Example 19 includes the subject matter of Example 18, wherein the dielectric material lining the chamber is the same as the gate dielectric material.

Example 20 includes the subject matter of Example 19, wherein the chamber lined with the gate dielectric material is further at least partially filled with the gate electrode material.

Example 21 includes the subject matter of Example 18, further including a gate dielectric material over the channel region and a gate electrode material over the gate dielectric material, wherein the dielectric material lining the chamber is a different material from the gate dielectric material.

Example 21 includes the subject matter of any of Examples 17-21, wherein the channel layer includes at least 80 at. % germanium.

Example 23 the subject matter of any of Examples 17-22, wherein the sub-fin insulation layer has a length corresponding to the entire length of the fin.

Example 24 includes the subject matter of any of Examples 17-23, wherein the sub-fin insulation layer has a width corresponding to the width of the fin.

Example 25 includes the subject matter of any of Examples 17-24, wherein the dielectric material lining the walls of the chamber further defines an elongate void having a length parallel to a length of the fin.

Example 26 includes the subject matter of any of Examples 17-25, wherein the chamber comprises an air gap.

Example 27 includes the subject matter of any of Examples 17-26, wherein the chamber is pinched-off.

Example 28 includes the subject matter of any of Examples 17-27, wherein the chamber is at least partially filled by another material different from the dielectric material lining the walls of the chamber.

Example 29 includes the subject matter of any of Examples 17-28, wherein the walls of the chamber are completely coated with the dielectric material lining the walls of the chamber, such that no portion is the chamber walls is uncoated with the dielectric material.

Example 30 is a computing system comprising an integrated circuit of any of Examples 17-29.

Example 31 is a method for fabricating semiconductor device including providing a substrate, the substrate including at least one fin including a channel layer, a dielectric layer between each of the at least one fins, a sacrificial layer in a sub-fin region between the substrate and the channel layer, removing a portion of the dielectric material between each of the at least one fins to expose a step of the sacrificial layer, removing at least a portion of the sacrificial layer from the sub-fin region between the substrate and the channel layer, thereby exposing a chamber, and depositing a dielectric material in the chamber.

Example 32 includes the subject matter of example 31, wherein the sacrificial layer in the sub-fin region does not extend under the dielectric layer between the at least one fins.

Example 33 includes the subject matter of any of Examples 31 and 32, wherein the dielectric material is conformally deposited on surfaces defining walls of the chamber.

Example 34 includes the subject matter of any of claims 31-33, wherein the conformal deposition of the dielectric defines an elongate void within the chamber.

Example 35 includes the subject matter of any of claims 31-34, wherein the deposition of the dielectric causes pinch-off at an opening to the chamber, the opening corresponding to the step.

Example 36 includes the subject matter of any of claims 31-35, wherein the portion of the sacrificial layer removed is disposed below a channel region of the at least one fin.

Example 37 includes the subject matter of any of claims 31-36, wherein the portion of the sacrificial layer removed is disposed below a channel region and at least a portion of a source region and a drain region of the at least one fin.

Example 38 includes the subject matter of any of claims 31-37, and further includes depositing an additional material in the chamber, the addition material being different than the dielectric material.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit device comprising:
   a substrate;
   a fin comprising semiconductor material;
   a gate structure at least over the fin, the gate structure including a gate dielectric and a gate electrode;
   a source region and a drain region, the fin being between the source and drain regions; and
   a chamber between the fin and the substrate, wherein the chamber is defined by walls that are completely lined with a dielectric material such that no portion of the chamber walls is uncoated with the dielectric material, and wherein the chamber lined with the dielectric material defines an air gap or void.

2. The integrated circuit device of claim 1, wherein the chamber extends such that it is also between the substrate and at least a portion of one or at least a portion of both of the source and drain regions.

3. The integrated circuit device of claim 1, wherein the gate dielectric is on a top as well as first and second sidewalls of the fin, and the gate electrode is adjacent to the gate dielectric that is on the top as well as first and second sidewalls of the fin.

4. The integrated circuit device of claim 1, wherein the dielectric material completely lining the chamber is the same as a dielectric material included in the gate dielectric.

5. The integrated circuit device of claim 4, wherein the chamber completely lined with the gate dielectric material is partially filled with gate electrode material, thereby leaving the air gap or void.

6. The integrated circuit device of claim 1, wherein the dielectric material completely lining the chamber is a different from a dielectric material included in the gate dielectric.

7. The integrated circuit device of claim 1, wherein the chamber has a width corresponding to a width of the fin.

8. The integrated circuit device of claim 1, wherein the fin includes a nanowire or nanoribbon, and the gate dielectric wraps around the nanowire or nanoribbon, and the gate electrode is adjacent to the gate dielectric.

9. The integrated circuit device of claim 1, wherein the chamber comprises a void.

10. The integrated circuit device of claim 1, wherein the chamber is partially filled with another material different from the dielectric material at least partially lining the walls of the chamber, thereby leaving the air gap or void.

11. The integrated circuit device of claim 1, wherein the dielectric material completely lining the walls of the chamber is conformal.

12. An integrated circuit device comprising:
a substrate;
a fin having a top and first and second sidewalls, the fin comprising a semiconductor material;
a gate structure adjacent the top and first and second sidewalls of the fin, the gate structure including a gate electrode and a gate dielectric between the fin and the gate electrode;
a source region and a drain region to either side of the gate structure; and
a chamber between the fin and the substrate, wherein the chamber is defined by walls that are completely lined with a dielectric material such that no portion of the chamber walls is uncoated with the dielectric material, and wherein the chamber lined with the dielectric material defines an air gap or a void.

13. The integrated circuit device of claim 12, wherein the chamber extends such that it is also between the substrate and at least a portion of one or at least a portion of both of the source and drain regions.

14. The integrated circuit device of claim 12, wherein the dielectric material completely lining the chamber is the same as a dielectric material included in the gate dielectric.

15. The integrated circuit device of claim 14, wherein the chamber completely lined with the gate dielectric material is further partially filled with gate electrode material, thereby leaving the air gap or void.

16. The integrated circuit device of claim 12, wherein the dielectric material completely lining the chamber is a different from a dielectric material included in the gate dielectric.

17. An integrated circuit device comprising:
a substrate;
a nanowire or nanoribbon comprising a semiconductor material;
a gate structure adjacent the nanowire or nanoribbon, the gate structure including a gate electrode and a gate dielectric between the gate electrode and the nanowire or nanoribbon;
a source region and a drain region, the nanowire or nanoribbon being between the source region and the drain region; and
a chamber between the substrate and the nanowire or nanoribbon, wherein the chamber is defined by walls that are completely lined with a dielectric material such that no portion of the chamber walls is uncoated with the dielectric material, and wherein the chamber lined with the dielectric material defines an air gap or void.

18. The integrated circuit device of claim 17, wherein the chamber extends such that it is also between the substrate and at least a portion of one or at least a portion of both of the source and drain regions.

19. The integrated circuit device of claim 17, wherein the dielectric material completely lining the chamber is the same as dielectric material included in the gate dielectric.

20. The integrated circuit device of claim 17, wherein the chamber at least partially lined with the gate dielectric material is further partially filled with gate electrode material, thereby leaving the air gap or void.

* * * * *